(12) United States Patent
Elaasar

(10) Patent No.: US 12,362,702 B2
(45) Date of Patent: Jul. 15, 2025

(54) INDUCTOR-CAPACITOR VOLTAGE-CONTROLLED OSCILLATOR WITH COMMON-MODE NOISE SEPARATION

(71) Applicant: Apple Inc., Cupertino, CA (US)

(72) Inventor: Omar E Elaasar, San Diego, CA (US)

(73) Assignee: Apple Inc., Cupertino, CA (US)

( * ) Notice: Subject to any disclaimer, the term of this patent is extended or adjusted under 35 U.S.C. 154(b) by 28 days.

(21) Appl. No.: 18/472,174

(22) Filed: Sep. 21, 2023

(65) Prior Publication Data
US 2025/0105785 A1     Mar. 27, 2025

(51) Int. Cl.
*H03B 5/12*     (2006.01)
*H04B 1/04*     (2006.01)

(52) U.S. Cl.
CPC ......... *H03B 5/1212* (2013.01); *H03B 5/1228* (2013.01); *H04B 1/04* (2013.01); *H03B 2200/0088* (2013.01)

(58) Field of Classification Search
CPC ............... H03B 5/1212; H03B 5/1228; H03B 2200/0088; H04B 1/04
USPC ................................ 331/179, 2, 167, 117 FE
See application file for complete search history.

(56) References Cited

U.S. PATENT DOCUMENTS

| | | | |
|---|---|---|---|
| 7,961,056 B2 | 6/2011 | Taylor et al. | |
| 8,058,938 B2 | 11/2011 | Aga et al. | |
| 8,432,229 B2 | 4/2013 | Dong et al. | |
| 9,093,950 B2 | 7/2015 | Ashckenazi et al. | |
| 9,214,895 B2 | 12/2015 | Shanan | |
| 10,110,370 B2 | 10/2018 | Chen et al. | |
| 11,165,389 B1 | 11/2021 | Komijani et al. | |
| 2004/0150485 A1 | 8/2004 | Muramatsu | |
| 2012/0286889 A1 | 11/2012 | Park et al. | |
| 2014/0292419 A1* | 10/2014 | Ragonese | H03B 1/02 331/46 |
| 2015/0180528 A1 | 6/2015 | Ragonese et al. | |

(Continued)

FOREIGN PATENT DOCUMENTS

KR     101138487 B1     4/2012

OTHER PUBLICATIONS

Jain Sanjeev et al.; "Oscillation Mode Swapping Dual-Band VCO"; IEEE Microwave and Wireless components Letters, vol. 26, No. 3, Mar. 31, 2016 (XP011602435); pp. 210-212.

(Continued)

*Primary Examiner* — Arnold M Kinkead
(74) *Attorney, Agent, or Firm* — FLETCHER YODER PC

(57) ABSTRACT

This disclosure is directed to a Voltage-Controlled Oscillator (VCO) with improved phase noise compared to other VCOs. The VCO may include a first cell and a second cell separated by common-mode (CM) isolation circuitry to reduce an amplitude of CM noise at an output signal. The CM isolation circuitry may inductively couple the first cell to the second cell for generating the output signal based on a resonant frequency range including resonant frequencies of the CM isolation circuitry, the first cell, and the second cell. As such, the first cell and the second cell may each include a portion of an entirety of the CM noise. In some cases, the portions of the CM noise on the first cell and/or the second cell may improve a signal to noise ratio of the output signal.

20 Claims, 7 Drawing Sheets

(56) References Cited

U.S. PATENT DOCUMENTS

2017/0244361 A1    8/2017  Farazian et al.
2020/0295765 A1*   9/2020  Agrawal ................. H03L 7/083

OTHER PUBLICATIONS

International Search Report and Written Opinion for PCT Application No. PCT/US2024/045482 dated Jan. 9, 2025; 14 pgs.

* cited by examiner

INDUCTOR-CAPACITOR VOLTAGE-CONTROLLED OSCILLATOR WITH COMMON-MODE NOISE SEPARATION

BACKGROUND

The present disclosure relates generally to wireless communication, and more specifically to voltage-controlled oscillators of transmitter and/or receiver circuits.

In some applications, a voltage-controlled oscillator (VCO) may include current-source circuitry and resonator circuitry. The current-source circuitry may generate a direct current (DC) signal based on receiving a bias voltage. The resonator circuitry may generate a VCO output signal based on the DC signal. For example, the resonator circuitry may generate the output signal with a desired oscillation frequency and voltage amplitude based on an inductive and/or capacitive value of components of the resonator circuitry and an electrical current value of the DC signal. In some cases, the current-source circuitry and/or the resonator circuitry may include one or more non-linear capacitors among other components. A change in a voltage value across a non-linear capacitor may correspond to a change in the capacitance value of the non-linear capacitor. The changes in the capacitance value of the non-linear capacitors may generate undesired noise on a phase and/or frequency of the output signal.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, an electronic device may include an antenna and a voltage-controlled oscillator (VCO) including a first voltage-controlled current source, a first inductor-capacitor tank circuit coupled to the first voltage-controlled current source, a second inductor-capacitor tank circuit that may inductively couple to the first inductor-capacitor tank circuit, and a second voltage-controlled current source coupled to the second inductor-capacitor tank circuit and coupled to a ground terminal.

In another embodiment, a voltage-controlled oscillator (VCO) may include a first inductor-capacitor tank circuit that may receive a direct current (DC) signal and a second inductor-capacitor tank circuit that may inductively couple to the first inductor-capacitor tank circuit to generate an output signal having a desired oscillation frequency within a resonant frequency range based on the DC signal, the second inductor-capacitor tank circuit may inductively uncouple from the first inductor-capacitor tank circuit based on signals having an undesired oscillation frequency outside the resonant frequency range.

In yet another embodiment, a voltage-controlled oscillator (VCO) may include a first voltage-controlled current source that may couple to a voltage source, a first inductor-capacitor tank circuit coupled to the first voltage-controlled current source, a second inductor-capacitor tank circuit that may inductively couple to the first inductor-capacitor tank circuit, and a second voltage-controlled current source coupled to the second inductor-capacitor tank circuit and may couple to a ground terminal.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

Figure 1:
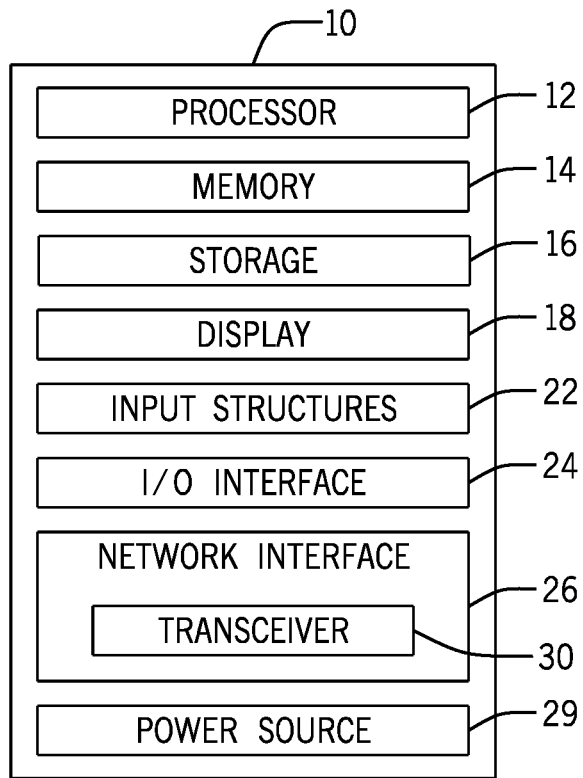
FIG. 1 is a block diagram of an electronic device, according to embodiments of the present disclosure.

When introducing elements of various embodiments of the present disclosure, the articles "a," "an," and "the" are intended to mean that there are one or more of the elements. The terms "comprising." "including." and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately." "near," "about." "close to," and/or "substantially"

should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on. Additionally, the term "set" may include one or more. That is, a set may include a unitary set of one member, but the set may also include a set of multiple members.

This disclosure is directed to an inductor-capacitor (LC) voltage-controlled oscillator (VCO), hereinafter referred to as a VCO, with reduced phase noise compared to other VCOs that do not include the disclosed embodiments. The VCO may generate an output signal (e.g., a differential output signal) with a desired oscillation frequency. The VCO may include differential circuitry for generating the output signal. If not compensated for, in some cases, the VCO may also generate undesired common-mode (CM) noise. The CM noise may cause undesired voltage and/or frequency offsets around the output signal causing undesired flicker and/or phase noise of the output signal. The VCO may include circuitry to reduce an amplitude of the undesired CM noises, as will be appreciated.

In some cases, one or more non-linear capacitors of the VCO may generate the CM noise. For example, voltage fluctuations across terminals of a non-linear capacitor may generate at least a portion of the CM noise. In different cases, the voltage fluctuations may be caused by thermally-induced noises, power supply voltage fluctuations, a gate-induced noise of one or more switches of the VCO, a noise of one or more VCO materials and/or components, a noise due to manufacturing processes and/or manufacturing process variations, a flicker noise of one or more complementary metal-oxide-semiconductor (CMOS) components of the VCO, or a combination thereof, among other things.

The VCO may include a first cell and a second cell. The first cell may include a first portion of (e.g., half of, near half of) non-linear capacitors of the VCO and the second cell may include a remaining portion of (e.g., half of, near half of) the non-linear capacitors. As such, the first cell may generate a portion of (e.g., half of, near half of) the CM noise and the second cell may generate a remaining portion of (e.g., half of, near half of) the CM noise.

The first cell may be coupled to the second cell via common-mode isolation circuitry to provide common-mode isolation (e.g., common-mode uncoupling, common-mode separation) between the first cell and the second cell. For example, the common-mode isolation circuitry may include a transmission line, a transformer, and/or an impedance circuit having a resonant frequency based on the desired oscillation frequency of the output signal. The common-mode isolation circuitry may conduct direct current (DC) signals and the output signal while reducing an amplitude of a CM noise of the first cell at the second cell and reducing an amplitude of a CM noise of the second cell at the first cell. As such, the first cell may generate a respective portion of the CM noise uncoupled from the remaining portion of the CM noise of the second cell. Moreover, output terminals of the VCO may be disposed on the first cell or the second cell. The VCO may output the output signal with a respective portion of (e.g., half of, near half of) the CM noise of the first cell or the second cell via the output terminals. Accordingly, the VCO may reduce an amplitude of the undesired CM noises to improve phase noise of the output signal.

Moreover, the first cell and the second cell may each include switches. In some embodiments, the first cell may include n-channel metal-oxide semiconductor (NMOS) switches and the second cell may include p-channel metal-oxide semiconductor (PMOS) switches. The VCO may generate the output signal with a higher voltage amplitude based on the common-mode isolation between the NMOS switches and the PMOS switches. For example, common-mode isolation of the NMOS switches from the PMOS switches may reduce a gate voltage dependency of the NMOS switches and the PMOS switches. As such, the common-mode isolation may increase a voltage amplitude through one or more of the NMOS switches and/or PMOS switches to generate the output signal with an increased voltage amplitude without increasing a power consumption of the VCO. The common-mode isolation between the first cell and the second cell may improve a signal-to-noise ratio (SNR) of the VCO for generating the output signal without increasing the power consumption of the VCO. Accordingly, the VCO may improve phase noise of the output signal by improving the SNR of the output signal.

Furthermore, drain terminals of the NMOS switches may be coupled to the common-mode isolation circuitry via at least one or more non-linear capacitors of the first cell. The first cell may conduct the respective portion of the CM noise away from the common-mode isolation circuitry. Similarly, drain terminals of the PMOS switches may be coupled to the common-mode isolation circuitry via at least one or more non-linear capacitors of the second cell. The second cell may conduct the remaining portion of the CM noise away from the common-mode isolation circuitry. As such, the first cell may conduct the respective portion of the CM noise inverted with respect to the remaining portion of the CM noise of the second cell.

In some cases, the CM noise and/or the inverted CM noise may combine with a gate voltage of one or more of the switches to increase a voltage amplitude through the one or more switches. As such, the VCO may generate the output signal with an increased voltage amplitude without increasing the power consumption of the VCO. That is, the VCO may generate the output signal with an improved SNR based on uncoupling and inverting the CM noise of the first cell and the second cell. Accordingly, the VCO may improve the phase noise of the output signal by improving the SNR of the output signal.

In some embodiments, an electronic device may include one or multiple VCOs to generate the output signal with one or more oscillation frequencies. The output signal of the VCO may correspond to a clock signal, a carrier signal for signal modulation, a frequency synthesis signal, and/or a frequency down-converted signal based on a received signal of the electronic device, among other things. As such, the VCO may improve operations of the electronic device based on generating improved signals with the desired oscillation frequencies, reduced noise, and/or reduced electrical power. In some embodiments, the improved signals may reduce a timing error rate and/or improve integrity of transmission data and/or reception data, among other things.

FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 22, an input/output (I/O) interface 24, a network interface 26, and a power source 29. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 22, the input/output (I/O) interface 24, the network interface 26, and/or the power source 29 may each be communicatively coupled directly or indirectly (e.g., through or via another component, a communication bus, a network) to one another to transmit and/or receive signals between one another. It should be noted that FIG. 1 is merely one example of a particular implementation and is intended to illustrate the types of components that may be present in the electronic device 10.

By way of example, the electronic device 10 may include any suitable computing device, including a desktop or notebook computer, a portable electronic or handheld electronic device such as a wireless electronic device or smartphone, a tablet, a wearable electronic device, and other similar devices. In additional or alternative embodiments, the electronic device 10 may include an access point, such as a base station, a router (e.g., a wireless or Wi-Fi router), a hub, a switch, and so on. It should be noted that the processor 12 and other related items in FIG. 1 may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. In some embodiments, the I/O interface 24 may include an I/O port for a hardwired connection for charging and/or content manipulation using a standard connector and protocol, such as the Lightning connector, a universal serial bus (USB), or other similar connector and protocol. The network interface 26 may include, for example, one or more interfaces for a personal area network (PAN), such as an ultra-wideband (UWB) or a BLUETOOTH® network, a local area network (LAN) or wireless local area network (WLAN), such as a network employing one of the IEEE 802.11x family of protocols (e.g., WI-FI®), and/or a wide area network (WAN), such as any standards related to the Third Generation Partnership Project (3GPP), including, for example, a 3rd generation (3G) cellular network, universal mobile telecommunication system (UMTS), 4th generation (4G) cellular network, Long Term Evolution® (LTE) cellular network, Long Term Evolution License Assisted Access (LTE-LAA) cellular network, $5^{th}$ generation (5G) cellular network, and/or New Radio (NR) cellular network, a $6^{th}$ generation (6G) or greater than 6G cellular network, a satellite network, a non-terrestrial network, and so on. In particular, the network interface 26 may include, for example, one or more interfaces for using a cellular communication standard of the 5G specifications that include the millimeter wave (mmWave) frequency range (e.g., 24.25-300 gigahertz (GHz)) that defines and/or enables frequency ranges used for wireless communication. The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 26 may include a transceiver 30. In some embodiments, all or portions of the transceiver 30 may be disposed within the processor 12. The transceiver 30 may support transmission and receipt of various wireless signals via one or more antennas, and thus may include a transmitter and a receiver. The power source 29 of the electronic device 10 may include any suitable source of power, such as a rechargeable lithium polymer (Li-poly) battery and/or an alternating current (AC) power converter.

Figure 2:
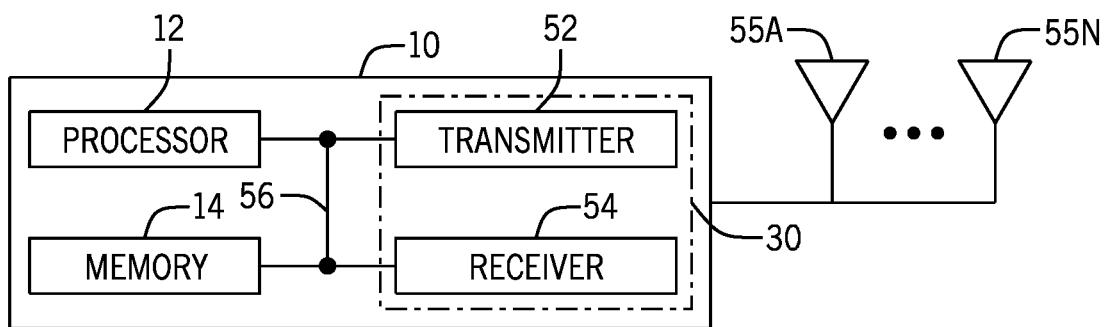
FIG. 2 is a functional diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the transceiver 30, a transmitter 52, a receiver 54, and/or antennas 55 (illustrated as 55A-55N, collectively referred to as an antenna 55) may be communicatively coupled directly or indirectly (e.g., through or via another component, a communication bus, a network) to one another to transmit and/or receive signals between one another.

The electronic device 10 may include the transmitter 52 and/or the receiver 54 that respectively enable transmission and reception of signals between the electronic device 10 and an external device via, for example, a network (e.g., including base stations or access points) or a direct connection. As illustrated, the transmitter 52 and the receiver 54 may be combined into the transceiver 30. The electronic device 10 may also have one or more antennas 55A-55N electrically coupled to the transceiver 30. The antennas 55A-55N may be configured in an omnidirectional or directional configuration, in a single-beam, dual-beam, or multi-beam arrangement, and so on. Each antenna 55 may be associated with one or more beams and various configurations. In some embodiments, multiple antennas of the antennas 55A-55N of an antenna group or module may be communicatively coupled to a respective transceiver 30 and each emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 52 and the receiver 54 may transmit and receive information via other wired or wireline systems or means.

As illustrated, the various components of the electronic device 10 may be coupled together by a bus system 56. The bus system 56 may include a data bus, for example, as well as a power bus, a control signal bus, and a status signal bus, in addition to the data bus. The components of the electronic device 10 may be coupled together or accept or provide inputs to each other using some other mechanism.

Figure 3:
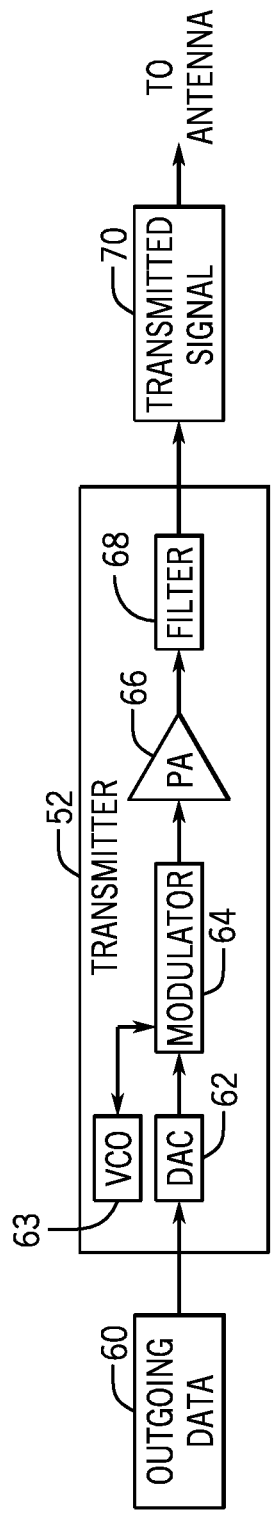
FIG. 3 is a schematic diagram of a transmitter of the electronic device of FIG. 1, according to embodiments of the present disclosure.

FIG. 3 is a schematic diagram of the transmitter 52 (e.g., transmit circuitry), according to embodiments of the present disclosure. As illustrated, the transmitter 52 may receive outgoing data 60 in the form of a digital signal to be transmitted via the one or more antennas 55. A digital-to-analog converter (DAC) 62 of the transmitter 52 may convert the digital signal to an analog signal. A VCO 63 may generate a carrier signal having a carrier frequency (e.g., a desired oscillation frequency). The VCO 63 may output an output signal (e.g., the carrier signal) to a modulator 64. A modulator 64 may combine the converted analog signal with the carrier signal to generate a radio wave. Alternatively or additionally, the VCO 63 may provide the carrier signal having the carrier frequency to any other viable circuitry, for example, to perform any other viable function.

A power amplifier (PA) 66 receives the modulated signal from the modulator 64. The power amplifier 66 may amplify the modulated signal to a suitable level to drive transmission of the signal via the one or more antennas 55. A filter 68 (e.g., filter circuitry and/or software) of the transmitter 52 may then remove undesirable noise from the amplified signal to generate transmitted signal 70 to be transmitted via the one or more antennas 55. The filter 68 may include any suitable filter or filters to remove the undesirable noise from the amplified signal, such as a bandpass filter, a bandstop filter, a low pass filter, a high pass filter, and/or a decimation filter.

Although the transmitter 52 is shown to include a single VCO 63, it should be appreciated that the electronic device 10 and/or the transmitter 52 may include additional VCOs 63. In different embodiments, the additional VCOs 63 may perform different operations of the electronic device 10 and/or the transmitter 52 such as frequency synthesis applications and clock generation applications. Furthermore, the power amplifier 66 and/or the filter 68 may be referred to as part of a radio frequency front end (RFFE), and more specifically, a transmit front end (TXFE) of the electronic device 10. Additionally, the transmitter 52 may include any suitable additional components not shown, or may not include certain of the illustrated components, such that the transmitter 52 may transmit the outgoing data 60 via the one or more antennas 55. For example, the transmitter 52 may include a mixer and/or a digital up converter. As another example, the transmitter 52 may not include the filter 68 if the power amplifier 66 outputs the amplified signal in or approximately in a desired frequency range (such that filtering of the amplified signal may be unnecessary).

Figure 4:
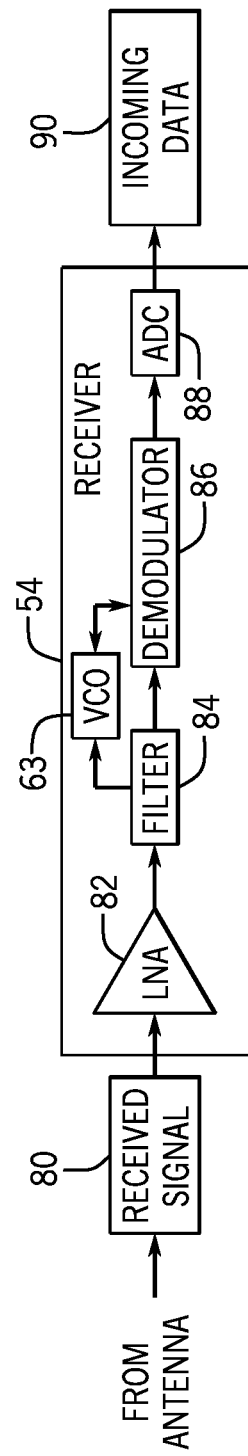
FIG. 4 is a schematic diagram of a receiver of the electronic device of FIG. 1, according to embodiments of the present disclosure.

FIG. 4 is a schematic diagram of the receiver 54 (e.g., receive circuitry), according to embodiments of the present disclosure. As illustrated, the receiver 54 may receive received signal 80 from the one or more antennas 55 in the form of an analog signal. A low noise amplifier (LNA) 82 may amplify the received analog signal to a suitable level for the receiver 54 to process. A filter 84 (e.g., filter circuitry and/or software) may remove undesired noise from the received signal 80, such as cross-channel interference. The filter 84 may also remove additional signal LNA 82s received by the one or more antennas 55 that are at frequencies other than the desired signal. The filter 84 may include any suitable filter or filters to remove the undesired noise or signals from the received signal 80, such as a bandpass filter, a bandstop filter, a low pass filter, a high pass filter, and/or a decimation filter. The low noise amplifier 82 and/or the filter 84 may be referred to as part of the RFFE, and more specifically, a receiver front end (RXFE) of the electronic device 10.

The receiver 54 may include the VCO 63 receiving the received signal 80. The VCO 63 may receive the received signal 80 from the filter 84. Alternatively or additionally, the VCO 63 may receive the received signal 80 from any other viable circuit (e.g., the one or more antennas 55, LNA 82). In some embodiments, the VCO 63 may generate an output signal with a desired oscillation frequency indicating a frequency and phase of the received signal 80. In alternative or additional embodiments, the VCO 63 may generate an oscillating signal that is mixed with the received signal 80 to produce an intermediate frequency (IF) signal for down conversion of a frequency of the incoming RF signal for processing. Although the receiver 54 is shown to include a single VCO 63, it should be appreciated that the receiver 54 may include additional VCOs 63. For example, the additional VCOs 63 may perform different operations of the receiver 54.

A demodulator 86 may remove a radio frequency carrier signal and/or extract a demodulated signal (e.g., an envelope signal) from the filtered signal for processing. In some embodiments, the demodulator 86 may receive the signal indicating a frequency and phase of the received signal 80 and/or the intermediate frequency (IF) signal from the VCO 63 to generate the remove a radio frequency carrier signal and/or extract a demodulated signal (e.g., an envelope signal) from the filtered signal for processing. An analog-to-digital converter (ADC) 88 may receive the demodulated analog signal and convert the signal to a digital signal of incoming data 90 to be further processed by the electronic device 10. Additionally, the receiver 54 may include any suitable additional components not shown, or may not include certain of the illustrated components, such that the receiver 54 may receive the received signal 80 via the one or more antennas 55. For example, the receiver 54 may include a mixer and/or a digital down converter.

Figure 5:
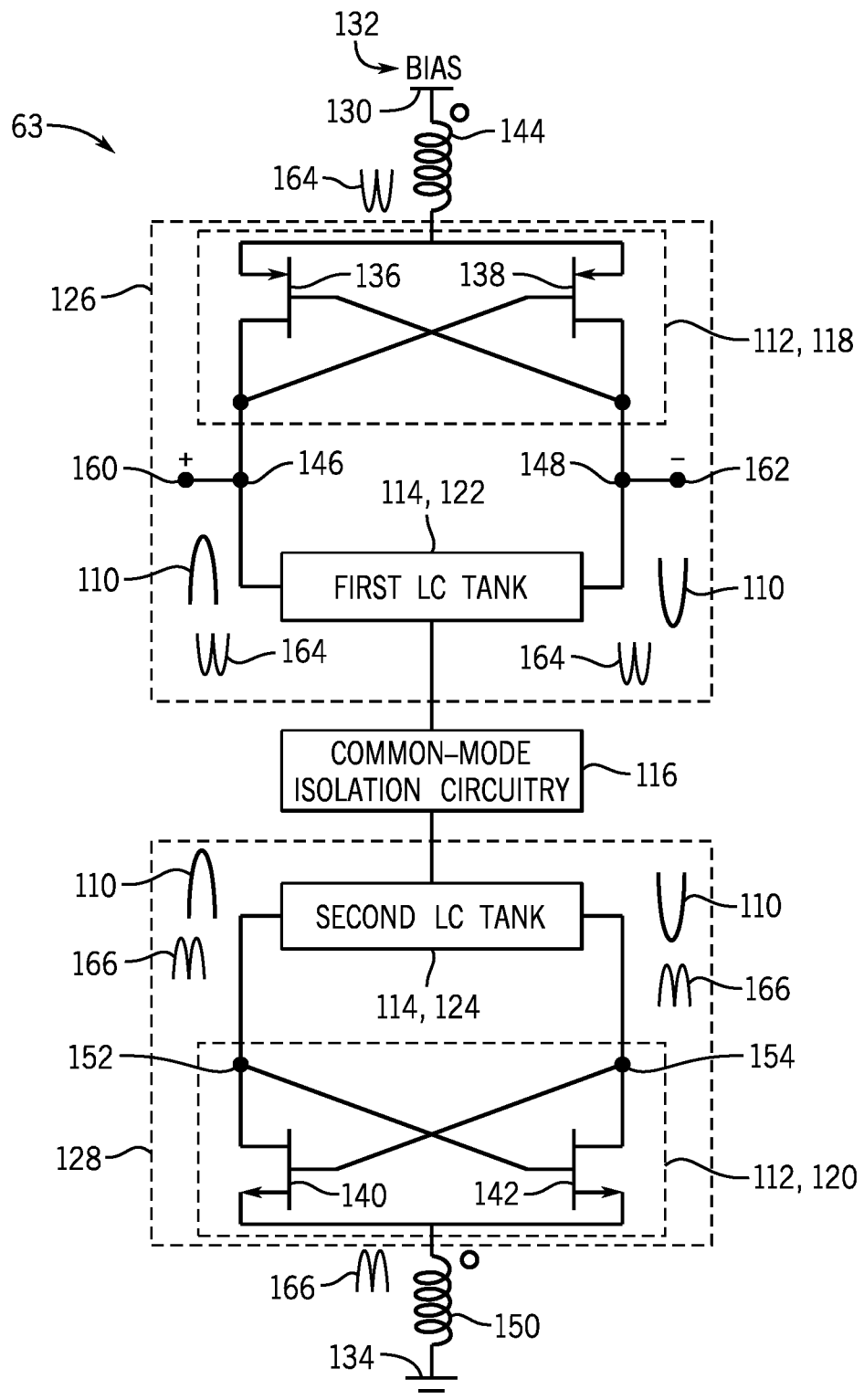
FIG. 5 is a schematic diagram of a voltage-controlled oscillator (VCO) of the transmitter of FIG. 3 and/or the receiver of FIG. 4 that may generate an output signal, according to embodiments of the present disclosure.

FIG. 5 is a schematic diagram of the VCO 63 of the transmitter 52 and/or the receiver 54 that may generate an output signal 110, according to embodiments of the present disclosure. The VCO 63 may include CMOS circuitry 112 (e.g., current-source circuitry), inductor-capacitor (LC) tank circuitry 114 (e.g., resonator circuitry), and common-mode isolation circuitry 116. The CMOS circuitry 112 may include an NMOS circuit 118 (e.g., a first voltage-controlled current source) and a PMOS circuit 120 (e.g., a second voltage-controlled current source). The LC tank circuitry 114 may include a first LC tank circuit 122 and a second LC tank circuit 124.

The VCO 63 may include a first cell 126 and a second cell 128 each including a portion of the CMOS circuitry 112 and the LC tank circuitry 114. In particular, the first cell 126 may include the NMOS circuit 118 and the first LC tank circuit 122. Moreover, the second cell 128 may include the PMOS circuit 120 and the second LC tank circuit 124. In different embodiments, the common-mode isolation circuitry 116 may be disposed on and/or may be coupled to the first cell 126 and the second cell 128. The common-mode isolation circuitry 116 may couple the first cell 126 to the second cell 128 for DC signals and signals having a desired oscillation frequency within a resonant frequency range and/or equal to a high threshold or a low threshold of the resonant frequency range. Moreover, the common-mode isolation circuitry 116 may uncouple (e.g., inductively uncouple) the first cell 126 from the second cell 128 for signals having an undesired oscillation frequency outside the resonant frequency range.

In the depicted embodiment, the NMOS circuit 118 may be coupled to a voltage source 130 to receive a bias voltage 132 (e.g., a DC signal). Alternatively or additionally, the VCO 63 may receive a received signal 80 discussed above in addition or in lieu of the bias voltage 132 from any other viable circuit (e.g., the one or more antennas 55, LNA 82). In any case, the NMOS circuit 118 may generate a DC signal with an amount of electrical current based on receiving the bias voltage 132, the received signal 80, among other possibilities. Moreover, the VCO 63 may generate and output the output signal 110 during operation based on receiving the bias voltage 132, the received signal 80, and/or any other viable input signal.

In some embodiments, the VCO 63 may generate the output signal 110 with an oscillation frequency (e.g., the desired oscillation frequency) based on a frequency and phase of the received signal 80. In alternative or additional embodiments, the VCO 63 may generate the output signal 110 with an oscillation frequency (e.g., the desired oscillation frequency) corresponding to a carrier signal having the carrier frequency for transmitting outgoing data 60 discussed above. In yet alternative or additional embodiments, the VCO 63 may generate the output signal 110 corresponding to an oscillating signal for mixing with the received signal 80 to produce an intermediate frequency (IF) signal for down conversion of a frequency of the incoming RF signal for processing.

The NMOS circuit 118 may be differentially coupled to the first LC tank circuit 122. The first LC tank circuit 122 may be coupled to the second LC tank circuit 124 via the common-mode isolation circuitry 116. As such, the first cell 126 may be coupled to the second cell 128 via the common-mode isolation circuitry 116. Moreover, the second LC tank circuit 124 may be differentially coupled to the PMOS circuit 120. The PMOS circuit 120 may be coupled to a ground terminal 134. For example, the ground terminal 134 may have a ground voltage such as a virtual ground voltage, 0 volts, or near 0 volts.

The PMOS circuit 120 may generate the DC signal with the amount of electrical current with the NMOS circuit 118 based on the bias voltage 132, the received signal 80, among other possibilities. The NMOS circuit 118 and the PMOS circuit 120 may each include a voltage-controlled current source to output the DC signal (e.g., the electrical current) to the first LC tank circuit 122 and the second LC tank circuit 124. The NMOS circuit 118 and the PMOS circuit 120 may provide the DC signal based on receiving the bias voltage 132 (or any other viable input signal) and the ground voltage.

The first LC tank circuit 122, the second LC tank circuit 124, and the common-mode isolation circuitry 116 may at least partly share the resonant frequency range. For example, the first LC tank circuit 122 and the second LC tank circuit 124 may have a resonant frequency corresponding to the desired oscillation frequency within the resonant frequency range. Moreover, the common-mode isolation circuitry 116 may couple (e.g., inductively couple) the first cell 126 to the second cell 128 for the DC signal and the signals having the desired oscillation frequency within the resonant frequency range. Accordingly, the first LC tank circuit 122 and the second LC tank circuit 124 may generate the output signal 110 (e.g., a differential output signal) having the desired oscillation frequency within the resonant frequency range based on receiving the DC signal, as will be appreciated.

In some embodiments, the common-mode isolation circuitry 116 may include a transmission line, a transformer, and/or an impedance circuit associated with the resonant frequency range. The common-mode isolation circuitry 116 may at least partly isolate common-mode signals of the first cell 126 and the second cell 128 having the undesired oscillation frequency outside the resonant frequency range. For example, the common-mode isolation circuitry 116 may at least partially uncouple (e.g., inductively uncouple) the first cell 126 from the second cell 128 for the common-mode signals of the first cell 126 and the second cell 128 having the undesired oscillation frequency outside the resonant frequency range.

In the depicted embodiment, the NMOS circuit 118 may include a first switch 136 (e.g., a first PMOS switch) and a second switch 138 (e.g., a second PMOS switch) forming a first voltage-controlled current source. Moreover, the PMOS circuit 120 may include a third switch 140 (e.g., a first NMOS switch) and a fourth switch 142 (e.g., a second NMOS switch) forming a second voltage-controlled current source. It should be appreciated that in alternative or additional embodiments, the NMOS circuit 118 and/or the PMOS circuit 120 may each include different switches, such as any viable transistor, and/or a different number of switches to provide the voltage-controlled current source.

Source terminals of the first switch 136 and the second switch 138 may be coupled to the voltage source 130 via a first degeneration inductor 144. The first degeneration inductor 144 may reduce noise and/or leakage of the voltage source 130 at the VCO 63 and/or reduce noise and/or leakage of the VCO 63 at the voltage source 130.

A gate terminal of the second switch 138 may be coupled (e.g., cross-coupled) to a drain terminal of the first switch 136 via a first node 146. A gate terminal of the first switch 136 may be coupled (e.g., cross-coupled) to a drain terminal of the second switch 138 via a second node 148. The drain terminal of the first switch 136 may be coupled to the first LC tank circuit 122 via the first node 146. The drain terminal of the second switch 138 may be coupled to the first LC tank circuit 122 via the second node 148.

Moreover, source terminals of the third switch 140 and the fourth switch 142 may be coupled to the ground terminal 134 via a second degeneration inductor 150. The second degeneration inductor 150 may reduce noise and/or leakage of the ground terminal 134 at the VCO 63 and/or reduce noise and/or leakage of the VCO 63 at the ground terminal 134.

A gate terminal of the fourth switch 142 may be coupled (e.g., cross-coupled) to a drain terminal of the third switch 140 via a third node 152. A gate terminal of the third switch 140 may be coupled (e.g., cross-coupled) to a drain terminal of the fourth switch 142 via a fourth node 154. The drain terminal of the third switch 140 may be coupled to the second LC tank circuit 124 via the third node 152. The drain terminal of the fourth switch 142 may be coupled to the second LC tank circuit 124 via the fourth node 154.

In the depicted embodiment, the drain terminal of the first switch 136 may be coupled to a positive output terminal 160 via the first node 146. Moreover, the drain terminal of the second switch 138 may be coupled to a negative output terminal 162 via the second node 148. As such, the positive output terminal 160 and the negative output terminal 162 may output the output signal 110.

It should be appreciated that in alternative or additional embodiments, the drain terminal of the third switch 140 may be coupled to a second positive output terminal via the third node 152 and the drain terminal of the fourth switch 142 may be coupled to a second negative output terminal via the fourth node 154. For example, the VCO 63 may include the second positive output terminal and the second negative output terminal in lieu of or in addition to the positive output terminal 160 and the negative output terminal 162. Accordingly, in alternative or additional embodiments, the second positive output terminal and the second negative output terminal may output the output signal 110 in lieu of or in addition to the positive output terminal 160 and the negative output terminal 162.

In different embodiments, the first LC tank circuit 122 and the second LC tank circuit 124 may include a different number of capacitors and inductors to generate the output signal 110. In specific cases, a capacitance value and an inductance value of the first LC tank circuit 122 and the second LC tank circuit 124 may be equal, nearly equal, or substantially equal. The capacitance value and the inductance value of the first LC tank circuit 122 and the second LC tank circuit 124 may correspond to the desired oscillation frequency of the output signal 110. As such, adjusting the capacitance value and/or the inductance value of the first LC tank circuit 122 and the second LC tank circuit 124 may tune the desired oscillation frequency of the output signal 110 within the resonant frequency range. In some cases, the desired oscillation frequency may be above a threshold (e.g., above 0.1 GHZ, above 1 GHZ, above 10 GHZ, above 19 GHZ, and so on) or within the resonant frequency range (e.g., 24.25-300 GHZ or mmWave frequencies, among other possibilities).

As mentioned above, the first LC tank circuit 122, the second LC tank circuit 124, and the common-mode isolation circuitry 116 may at least partly share the resonant frequency range. Moreover, the common-mode isolation circuitry 116 may couple the first LC tank circuit 122 and the second LC tank circuit 124 for the DC signal and may inductively couple the first LC tank circuit 122 and the second LC tank circuit 124 for signals having the desired oscillation frequency within the resonant frequency range. For example, the common-mode isolation circuitry 116 may include a transmission line, a transformer, and/or an impedance circuit associated with the resonant frequency range. As such, the common-mode isolation circuitry 116 may inductively couple the first LC tank circuit 122 and the second LC tank circuit 124 for the output signal 110 having the desired oscillation frequency. The first LC tank circuit 122 and the second LC tank circuit 124 may generate the output signal 110 having the desired oscillation frequency based on the inductive coupling via the common-mode isolation circuitry 116. Accordingly, the VCO 63 may output the output signal 110 having the desired oscillation frequency within the resonant frequency range.

In some cases, if not accounted for, the first switch 136, the second switch 138, the third switch 140, and/or the fourth switch 142 may include non-linear parasitic capacitors having non-linear capacitance values during operation. In additional or alternative cases, the first LC tank circuit 122 and/or the second LC tank circuit 124 may each include one or more non-linear capacitors (e.g., varactors) and/or one or more non-linear parasitic capacitors having non-linear capacitance values during operation. A voltage fluctuation across a non-linear capacitor may correspond to a change in the capacitance value of the non-linear capacitor.

If not accounted for, capacitance value changes of the non-linear capacitors may generate undesired CM noises 164 and 166 in response to undesired voltage fluctuations. In different cases, the voltage fluctuations may be caused by thermally induced noises, power supply voltage fluctuations, a gate induced noise of one or more switches of the VCO, a noise of one or more VCO materials and/or components, a noise due to manufacturing processes and/or manufacturing process variations, a flicker noise of one or more Complementary Metal-Oxide-Semiconductor (CMOS) components of the VCO, or a combination thereof, among other things.

In the depicted embodiment, the first cell 126 may include a first portion of (e.g., half of, near half of) non-linear capacitors of the VCO 63 and the second cell 128 may include a remaining portion of (e.g., half of, near half of) the non-linear capacitors. The first cell 126 may generate a portion of (e.g., half of, near half of) the CM noise 164 and the second cell 128 may generate a remaining portion of (e.g., half of, near half of) the CM noise 166 of the VCO 63. The CM noises 164 and 166 may have an undesired oscillation frequency outside the resonant frequency range of the common-mode isolation circuitry 116. As such, the common-mode isolation circuitry 116 may inductively uncouple the first cell 126 from the second cell 128 for the CM noises 164 and 166. Accordingly, the first cell 126 may generate the respective portion of the CM noise 164 at least partially uncoupled and/or isolated from the remaining portion of the CM noise 166 of the second cell 128. In some cases, the CM noises 164 and 166 may have the undesired oscillation frequency below a threshold (e.g., below 1 GHZ, below 220 kilohertz (KHz), below 100 KHz, and so on). The CM noises 164 and 166 may have a higher oscillation frequency than the DC signal. For example the DC signal may have an oscillation frequency below a threshold (e.g., below 100 KHz, below 10 KHz, below 1 KHz, and so on).

As mentioned above, the output terminals 160 and 162 of the VCO 63 may be disposed on the first cell 126. As such, the VCO 63 may output the output signal 110 with the respective portion of (e.g., half of, near half of) the CM noise 164 of the first cell 126 via the output terminals 160 and 162. Moreover, in alternative or additional embodiments, the VCO 63 may include the second output terminals disposed on the second cell 128. In such embodiments, the VCO 63 may output the output signal 110 with the remaining portion of (e.g., half of, near half of) the CM noise 166 of the second cell 128 via the second output terminals. In any case, the VCO 63 may output the output signal 110 with a portion of the CM noise 164 or 166 of the VCO 63 as compared to the entirety of the CM noises 164 and 166 of the VCO 63. Accordingly, the VCO 63 may reduce an amplitude of the undesired noises to improve phase noise of the output signal 110.

Moreover, a common-mode isolation of the NMOS circuit 118 from the PMOS circuit 120 may reduce a gate voltage dependency between one or more of the switches 136, 138, 140, and 142. In some cases, the VCO 63 may generate the output signal 110 with a higher voltage amplitude based on common-mode isolation between the first cell 126 and the second cell 128. The VCO 63 may generate the output signal 110 with an increased voltage amplitude without (e.g., without proportionately) increasing a power consumption of the VCO 63.

For example, one or more of the switches 136, 138, 140, and 142 may generate the output signal 110 with an increased voltage amplitude without increasing a power consumption of the VCO 63 based on the common-mode isolation. As such, the VCO 63 may generate the output signal 110 with an increased voltage amplitude without increasing a voltage amplitude of the CM noise 164 or 166. Accordingly, the VCO 63 may generate the output signal 110 with reduced phase noise based on improving an SNR of the output signal 110.

Furthermore, the drain terminals of the first switch 136 and the second switch 138 may be coupled to the first LC tank circuit 122 and the common-mode isolation circuitry 116. As such, the first switch 136 and the second switch 138 may conduct the respective portion of the CM noise 164 away from the common-mode isolation circuitry 116. Similarly, drain terminals of the third switch 140 and the fourth switch 142 may be coupled to the second LC tank circuit 124 and the common-mode isolation circuitry 116. As such, the third switch 140 and the fourth switch 142 may also conduct the remaining portion of the CM noise 166 away from the common-mode isolation circuitry 116. Accordingly, the first cell 126 may conduct the respective portion of the CM noise 164 inverted with respect to the remaining portion of the CM noise 166 of the second cell 128.

In some cases, the CM noise 164 or 166 and/or the inverted CM noise 164 or 166 may combine with a gate voltage of one or more of the switches 136, 138, 140, and 142 to increase a voltage amplitude through the respective switches 136, 138, 140, and 142. As such, the VCO 63 may generate the output signal 110 with an increased voltage amplitude without increasing the power consumption of the VCO 63. That is, the VCO 63 may generate the output signal 110 with an improved SNR based on uncoupling and inverting the CM noises 164 and 166 of the first cell 126 and the second cell 128. Accordingly, the VCO 63 may output the output signal 110 with reduced phase noise.

With the foregoing in mind, the VCO 63 may consume an amount of electrical power to generate the output signal 110 with a reduced phase noise compared to other VCOs. That is, the VCO 63 may have improved SNR for generating the output signal 110 without increased power consumption. Alternatively or additionally, the VCO 63 may generate the output signal 110 with a phase noise by consuming a reduced amount of electrical power compared to other VCOs. That is, the VCO 63 may have improved efficiency for generating the output signal 110 with the phase noise. Accordingly, the VCO 63 may improve operations of the transmitter 52, the receiver 54, and/or the electronic device 10 based on generating signals with improved signal integrity based the reduced noise and/or improved efficiency based on the reduced power consumption. For example, the improved signals may reduce a timing error rate and/or improve integrity of transmission data and/or reception data, among other things.

Figure 6:
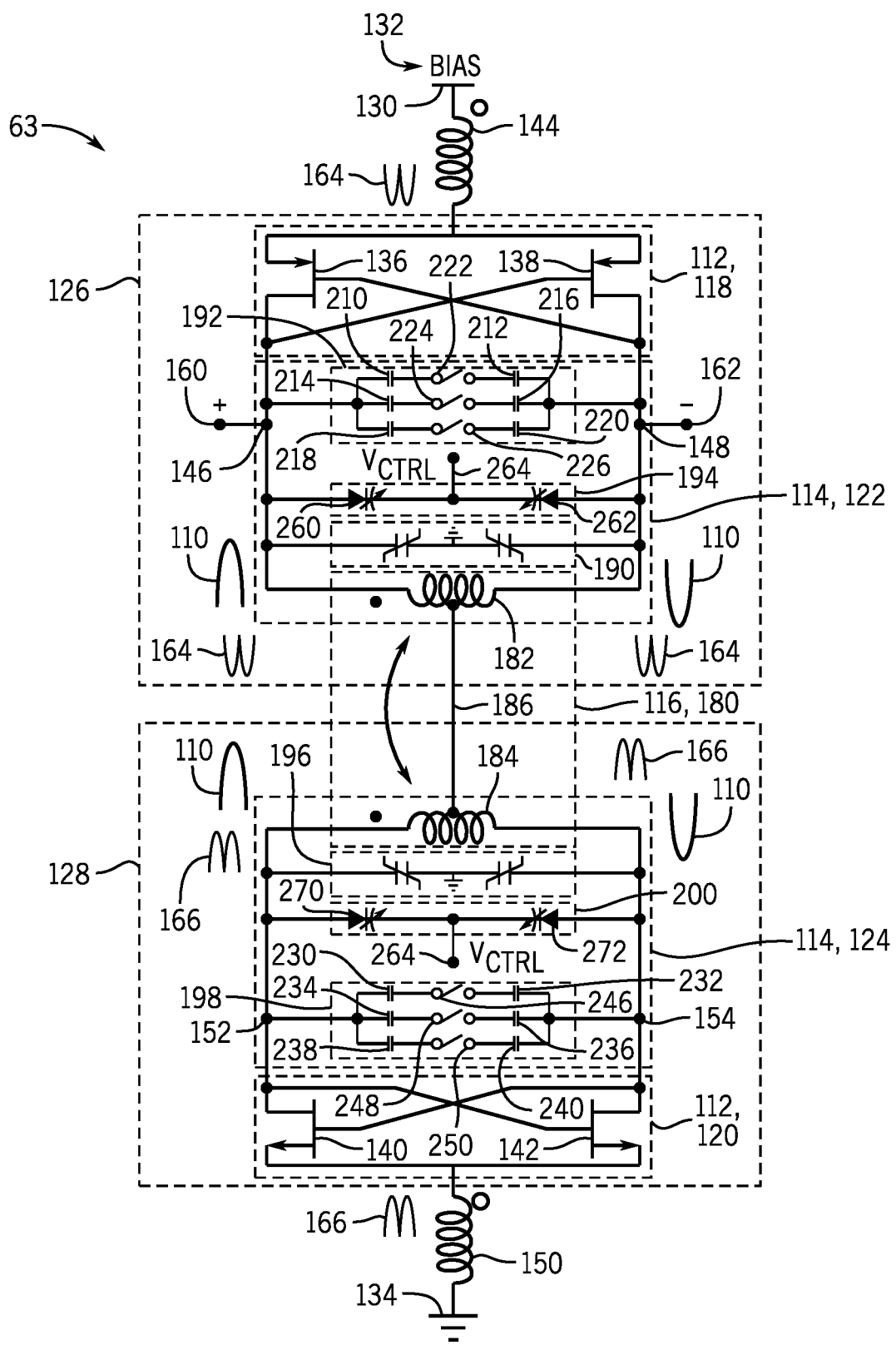
FIG. 6 is a schematic diagram of the VCO of FIG. 5 where common-mode isolation circuitry of the VCO includes a transformer, according to embodiments of the present disclosure.

FIG. 6 is a schematic diagram of the VCO 63 where the common-mode isolation circuitry 116 includes a transformer 180, according to embodiments of the present disclosure. The transformer 180 may include a first inductor 182 and a second inductor 184. Moreover, the common-mode isolation circuitry 116 may include a transmission line 186 coupled to the first inductor 182 and the second inductor 184. For example, the transmission line 186 may be tapped onto the first inductor 182 and the second inductor 184. The transmission line 186 may conduct the DC signal (e.g., the electrical currents) between the first cell 126 and the second cell 128. Accordingly, the NMOS circuit 118 and the PMOS circuit 120 may generate the DC signal based on the bias voltage 132.

The first cell 126 may include the first inductor 182 and the second cell 128 may include the second inductor 184. The first inductor 182 may be coupled to the drain terminal of the first switch 136 via the first node 146 and may be coupled to the drain terminal of the second switch 138 via the second node 148. The second inductor 184 may be coupled to the drain terminal of the third switch 140 via the third node 152 and may be coupled to the drain terminal of the fourth switch 142 via the fourth node 154. As such, the first inductor 182 and the second inductor 184 may differentially receive the DC signal in response to the VCO 63 receiving the bias voltage 132 (or any other viable input signal).

The first inductor 182 and the second inductor 184 may inductively couple with a coupling factor (K) equal to or above a first threshold for signals having an oscillation frequency within the resonant frequency range. The first threshold may be 0.3, 0.4, 0.44, 0.5, 0.72, 0.76, 0.9, or 1, among other possibilities. In different embodiments, the first inductor 182 and the second inductor 184 may have different dimensions corresponding to the resonant frequency range.

As mentioned above, the first LC tank circuit 122 and the second LC tank circuit 124 may generate the output signal 110 having the desired oscillation frequency within the resonant frequency range. As such, the first inductor 182 may inductively couple to the second inductor 184 for the output signal 110 of the VCO 63 based on the output signal 110 having the desired oscillation frequency. Accordingly, the transformer 180 may inductively couple the first cell 126 to the second cell 128 for the output signal 110.

Moreover, the first inductor 182 and the second inductor 184 may inductively uncouple for signals having an oscillation frequency outside the resonant frequency range based on a coupling factor equal to or below a second threshold. The second threshold may be 1, 0.9, 0.85, 0.72, 0.64, 0.5, 0.4, 0.2, 0.1, or 0.5, among other possibilities. As such, the first inductor 182 and the second inductor 184 may inductively uncouple for the CM noises 164 and 166 having the undesired oscillation frequency outside the resonant frequency range. Accordingly, the transformer 180 may at least partly uncouple and/or isolate the first cell 126 from the second cell 128 for the CM noises 164 and 166.

In the depicted embodiment, the first LC tank circuit 122 may include the first inductor 182, a first capacitor bank 190, a first switched capacitor circuit 192, and a first varactor 194. Moreover, the second LC tank circuit 124 may include the second inductor 184, a second capacitor bank 196, a second switched capacitor circuit 198, and a second varactor 200. In some cases, a capacitance value and an inductance value of the first LC tank circuit 122 and the second LC tank circuit 124 may be equal, nearly equal, or substantially equal. It should be appreciated that in different embodiments, the first LC tank circuit 122 and the second LC tank circuit 124 may include different circuit components. For example, the first LC tank circuit 122 and the second LC tank circuit 124 may include a different number of capacitors and/or inductors to generate the output signal 110.

The first capacitor bank 190 and the second capacitor bank 196 may each include a number of capacitors. In some embodiments, one or more of the capacitors of the first capacitor bank 190 and/or the second capacitor bank 196 may be coupled to the ground terminal 134. It should be appreciated that in different embodiments, the first capacitor bank 190 and the second capacitor bank 196 may each include a different number of capacitors. In some cases, the first capacitor bank 190 and the second capacitor bank 196 may each include a number of non-linear capacitors.

The first switched capacitor circuit 192 may include primary capacitors 210, 212, 214, 216, 218, and 220 and primary switches 222, 224, and 226. The first primary capacitor 210 and the second primary capacitor 212 may couple to the positive output terminal 160 and the negative output terminal 162 via the first node 146 and the second node 148, respectively, based on closing the first primary switch 222. The third primary capacitor 214 and the fourth primary capacitor 216 may couple to the positive output terminal 160 and the negative output terminal 162 via the first node 146 and the second node 148, respectively, based on closing the second primary switch 222. The fifth primary capacitor 218 and the sixth primary capacitor 220 may couple to the positive output terminal 160 and the negative output terminal 162 via the first node 146 and the second node 148, respectively, based on closing the third primary switch 222.

The second switched capacitor circuit 198 may include secondary capacitors 230, 232, 234, 236, 238, and 240 and secondary switches 246, 248, and 250. The first secondary capacitor 230 and the second secondary capacitor 232 may couple to the positive output terminal 160 and the negative output terminal 162 via the third node 152 and the fourth node 154, respectively, based on closing the first secondary switch 246. The third secondary capacitor 234 and the fourth secondary capacitor 236 may couple to the positive output terminal 160 and the negative output terminal 162 via the third node 152 and the fourth node 154, respectively, based on closing the second secondary switch 248. The fifth secondary capacitor 238 and the sixth secondary capacitor 240 may couple to the positive output terminal 160 and the negative output terminal 162 via the third node 152 and the fourth node 154, respectively, based on closing the third secondary switch 250.

As described above, the electronic device 10 may include the VCO 63. In some embodiments, the processor 12 of the electronic device 10 may generate control signals to open and close each of the primary switches 222, 224, and 226 and/or the secondary switches 246, 248, and 250 to adjust the capacitance value of the first LC tank circuit 122 and the second LC tank circuit 124. Alternatively or additionally, any other viable circuitry may generate the control signals.

The capacitance value and the inductance value of the first LC tank circuit 122 and the second LC tank circuit 124 may be equal, nearly equal, or substantially equal. In some cases, each of the primary capacitors 210, 212, 214, 216, 218, and 220 may have a capacitance value corresponding to a capacitance value of a respective secondary capacitor 230, 232, 234, 236, 238, and 240. In specific cases, each of the primary capacitors 210, 212, 214, 216, 218, and 220 may have a capacitance value equal to or near equal to a capacitance value of a respective secondary capacitor 230, 232, 234, 236, 238, and 240.

Moreover, the processor 12 may open and close the first primary switch 222 with the first secondary switch 246, the second primary switch 222 with the second secondary switch 248, and the third primary switch 222 with the third secondary switch 250. Accordingly, the capacitance value and the inductance value of the first LC tank circuit 122 and the second LC tank circuit 124 may be adjusted equally, near equally, or substantially equally in response to opening and closing the primary switches 222, 224, and 226 and/or the secondary switches 246, 248, and 250.

The first varactor 194 may include a first primary junction diode 260 and a second primary junction diode 262. The second varactor 200 may include a first secondary junction diode 270 and a second secondary junction diode 272. The first varactor 194 and the second varactor 200 may receive a tuning voltage ($V_{CTRL}$) 264 (or control voltage 264) to adjust and/or control a capacitance value of the first primary junction diode 260, the second primary junction diode 262, the first secondary junction diode 270, and the second secondary junction diode 272. In some cases, the processor 12 may generate the tuning voltage 264. Alternatively or additionally, any other viable circuitry may generate the tuning voltage 264.

As mentioned above, the capacitance value and the inductance value of the first LC tank circuit 122 and the second LC tank circuit 124 may be equal, nearly equal, or substantially equal. In some cases, each of the first primary junction diode 260, the first secondary junction diode 270, the second primary junction diode 262, and the second secondary junction diode 272 may have corresponding capacitance values (e.g., an equal or near equal capacitance value). Moreover, the tuning voltage 264 may be provided to the first varactor 194 and the second varactor 200. Accordingly, the capacitance value and the inductance value of the first LC tank circuit 122 and the second LC tank circuit 124 may be adjusted equally, near equally, or substantially equally based on tuning the first varactor 194 and the second varactor 200.

The capacitance value of the first LC tank circuit 122 and the second LC tank circuit 124 may correspond to the desired oscillation frequency of the output signal 110. As such, adjusting the capacitance value of the first LC tank circuit 122 and the second LC tank circuit 124 may adjust the desired oscillation frequency of the output signal 110. Accordingly, opening and closing the primary switches 222, 224, and 226 and secondary switches 246, 248, and 250 and/or adjusting the voltage value of the tuning voltage 264 may tune the desired oscillation frequency of the output signal 110.

As discussed above, the first cell 126 may include a first portion of (e.g., half of, near half of) non-linear capacitors of the VCO 63 and the second cell 128 may include a remaining portion of (e.g., half of, near half of) the non-linear capacitors. In some embodiments, one or more capacitors of the first capacitor bank 190 and/or the second capacitor bank 196 may have non-linear capacitance values and/or may form non-linear parasitic capacitors during operation of the VCO 63. Alternatively or additionally, one or more of the primary capacitors 210, 212, 214, 216, 218, and/or 220 of the first switched capacitor circuit 192 and/or one or more of the secondary capacitors 230, 232, 234, 236, 238, and/or 240 of the second switched capacitor circuit 198 may have non-linear capacitance values and/or may form non-linear parasitic capacitors during operation of the VCO 63. Alternatively or additionally, one or more of the first primary junction diode 260, the first secondary junction diode 270, the second primary junction diode 262, and the second secondary junction diode 272 of the first varactor 194 and/or the second varactor 200 may have non-linear capacitance values and/or may form non-linear parasitic capacitors during operation of the VCO 63. Furthermore, each of the switches 136, 138, 140, and/or 142 may form one or more non-linear parasitic capacitors between one or more respective terminals during operation of the VCO 63.

In any case, as mentioned above, the capacitance value and the inductance value of the first LC tank circuit 122 and the second LC tank circuit 124 may be equal, nearly equal, or substantially equal. In some cases, capacitance variations based on the non-linear capacitance values of the first LC tank circuit 122 of the first cell 126 and the second LC tank circuit 124 of the second cell 128 may also be equal, nearly equal, or substantially equal. As such, the first cell 126 and the second cell 128 may each generate a respective portion of an entirety of CM noises 164 and 166 of the VCO 63 when generating the output signal 110 with the desired oscillation frequency. Moreover, the transformer 180 may at least partly uncouple and/or isolate the first cell 126 from the second cell 128 for the CM noises 164 and 166. Accordingly, the first cell 126 and the second cell 128 may each include an equal portion of, half of, or near half of the entirety of CM noises 164 and 166 during operation of the VCO 63.

As such, inductive coupling the first cell 126 and the second cell 128 via the common-mode isolation circuitry 116 may reduce the undesired voltage and/or the frequency offsets of the output signal 110 based on the first CM noise 164 and/or the second CM noise 166. Moreover, the VCO 63 may have improved SNR for generating the output signal 110 without increased power consumption. Alternatively or additionally, the VCO 63 may generate the output signal 110 with a phase noise by consuming a reduced amount of electrical power compared to other VCOs. That is, the VCO 63 may have improved efficiency for generating the output signal 110 with the phase noise. Accordingly, the VCO 63 may improve operations of the transmitter 52, the receiver 54, and/or the electronic device 10 based on generating signals with improved signal integrity based the reduced noise and/or improved efficiency based on the reduced power consumption. For example, the improved signals may reduce a timing error rate and/or improve integrity of transmission data and/or reception data, among other things.

With the foregoing in mind, the first LC tank circuit 122 may include a portion of the common-mode isolation circuitry 116 based on including the first inductor 182. Moreover, the second LC tank circuit 124 may include a second portion of the common-mode isolation circuitry 116 based on including the second inductor 184. The first inductor 182 may form the first LC tank circuit 122 with the first capacitor bank 190, the first switched capacitor circuit 192, and the first varactor 194 and may form the common-mode isolation circuitry 116 with the second inductor 184. Similarly, the second inductor 184 may form the second LC tank circuit 124 with the second capacitor bank 196, the second switched capacitor circuit 198, and the second varactor 200 and may form the common-mode isolation circuitry 116 with the first inductor 182. That is, the common-mode isolation circuitry 116, the first LC tank circuit 122, and the second LC tank circuit 124 may share the first LC tank circuit 122 and the second inductor 184. As such, in some embodiments, the common-mode isolation circuitry 116, the first LC tank circuit 122, and/or the second LC tank circuit 124 may occupy less area based on sharing the first LC tank circuit 122 and the second inductor 184 compared to having exclusive inductors that are not shared.

Moreover, the first inductor 182 may be disposed in proximity of the second inductor 184. In some embodiments, the second inductor 184 may be overlaid on or under the first inductor 182, for example, on or into a printed circuit board (PCB), among other possibilities. As such, the first inductor 182 and the second inductor may occupy less area compared to an area occupied by the first inductor 182 and the second inductor 184 being disposed with a different disposition (e.g., side-by-side). In some cases, the first inductor 182 and the second inductor 184 may occupy an area corresponding to an area of either of the first inductor 182 or the second inductor 184 that is less than the area occupied by the first inductor 182 and the second inductor 184 disposed with a different disposition. For example, the first inductor 182 and the second inductor 184 may occupy an area corresponding to a portion of the area occupied by the first inductor 182 and the second inductor 184 being disposed side-by-side.

Figure 7:
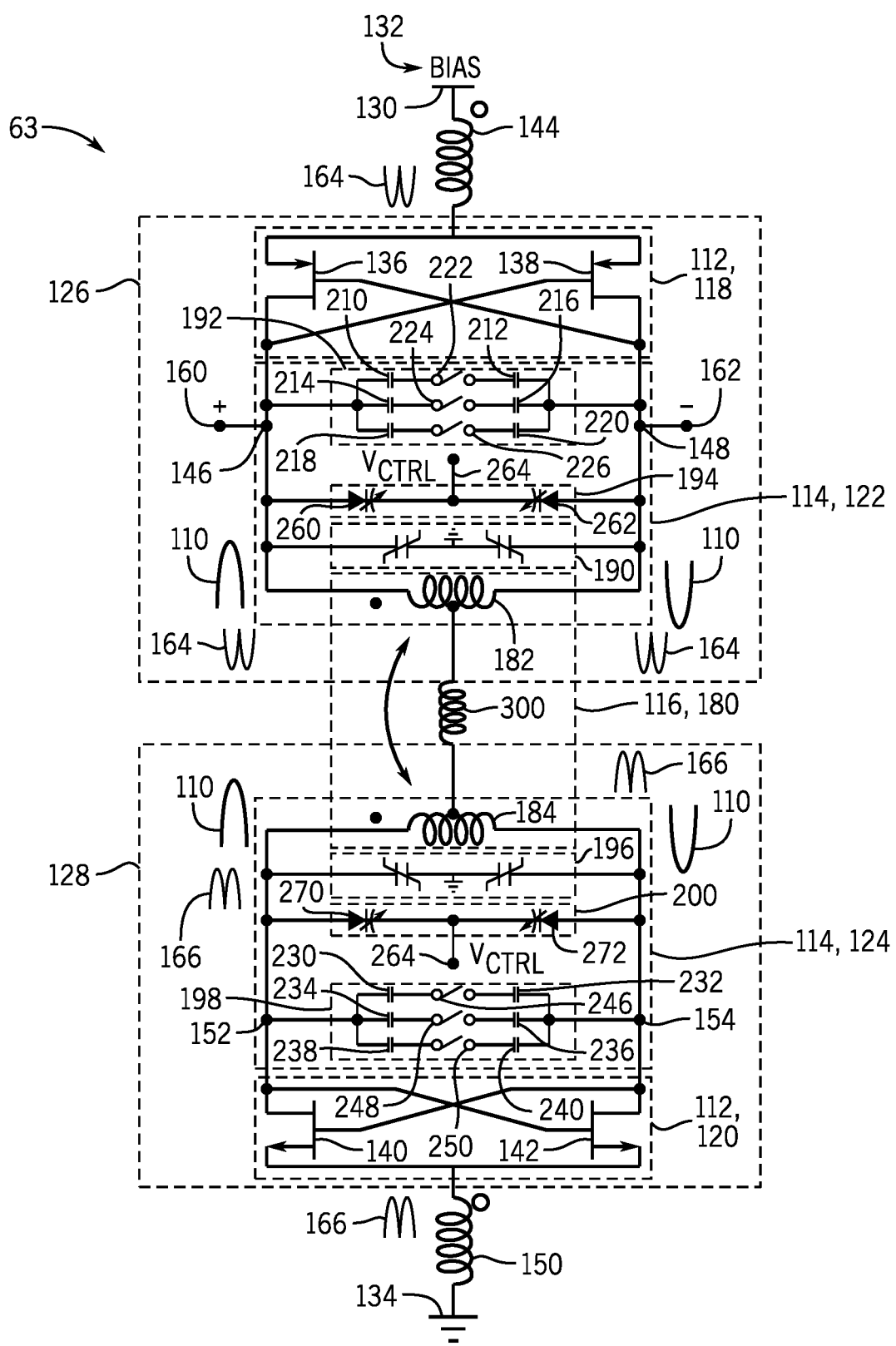
FIG. 7 is a schematic diagram of the VCO of FIG. 6 where the common-mode isolation circuitry includes the transformer and a common-mode degeneration inductor, according to embodiments of the present disclosure.

FIG. 7 is a schematic diagram of the VCO 63 where the common-mode isolation circuitry 116 includes the transformer 180 and a common-mode degeneration inductor 300, according to embodiments of the present disclosure. As mentioned above, the common-mode isolation circuitry 116 may include an impedance circuit associated with the resonant frequency range. In the depicted embodiment, the common-mode isolation circuitry 116 may include the common-mode degeneration inductor 300 coupled to (e.g., tapped onto) the first inductor 182 and the second inductor 184 having the resonant frequency range.

The common-mode degeneration inductor 300 may conduct the DC signal (e.g., the electrical currents) between the first cell 126 and the second cell 128. Accordingly, the NMOS circuit 118 and the PMOS circuit 120 may generate the DC signal based on the bias voltage 132. Moreover, the common-mode degeneration inductor 300 may have an impedance value corresponding to uncoupling the signals having an oscillation frequency outside the resonant frequency range. As such, the common-mode degeneration inductor 300 may reduce an amplitude of noise and/or leakage of the first cell 126 (e.g., the CM noise 164) at the second cell 128 and/or reduce an amplitude of noise and/or leakage of the second cell 128 (e.g., the CM noise 166) at the first cell 126.

As discussed above, the first inductor 182 and the second inductor 184 may inductively couple with a coupling factor (K) equal to or above the first threshold for signals having an oscillation frequency within the resonant frequency range. Moreover, the first inductor 182 and the second inductor 184 may inductively uncouple for signals having an oscillation frequency outside the resonant frequency range based on a coupling factor equal to or below a second threshold. Accordingly, the VCO 63 may generate the output signal 110 having the desired oscillation frequency within the resonant frequency range with reduced phase noise based on including the common-mode degeneration inductor 300.

Figure 8:
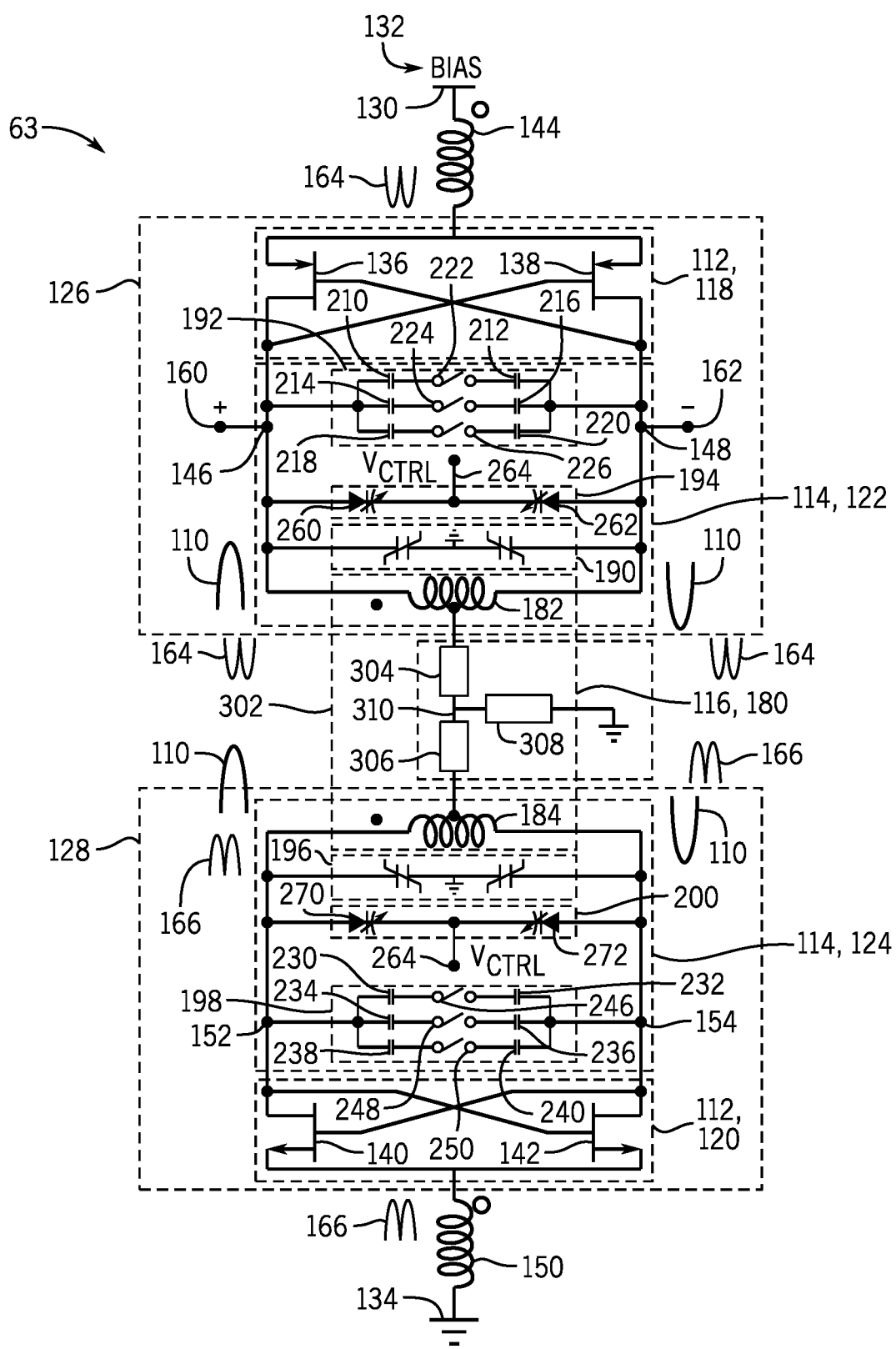
FIG. 8 is a schematic diagram of the VCO of FIG. 6 where the common-mode isolation circuitry includes the transformer and a T-section impedance circuit, according to embodiments of the present disclosure.

FIG. 8 is a schematic diagram of the VCO 63 where the common-mode isolation circuitry 116 includes the transformer 180 and a T-section impedance circuit 302, according to embodiments of the present disclosure. In the depicted embodiment, the common-mode isolation circuitry 116 may include the T-section impedance circuit 302 coupled to (e.g., tapped onto) the first inductor 182 and the second inductor 184. The T-section impedance circuit 302 may include a first impedance component 304 coupled to (e.g., tapped onto) the first inductor 182. The T-section impedance circuit 302 may include a second impedance component 306 coupled to the second inductor 184 and coupled to the first impedance component 304 via a fifth node 310. The T-section impedance circuit 302 may include a third impedance component 308 coupled to the first impedance component 304 and the second impedance component 306 via the fifth node 310. For example, the third impedance component 308 may also be coupled to the ground terminal 134.

The T-section impedance circuit 302 may have an impedance value corresponding to uncoupling the signals having an oscillation frequency outside the resonant frequency range (e.g., CM noises 164 and 166). The first impedance component 304, the second impedance component 306, and the third impedance component 308 may each include a programmable or non-programmable resistor, capacitor, and/or inductor. For example, the first impedance component 304, the second impedance component 306, and/or the third impedance component 308 may include the common-mode degeneration inductor 300 among other possibilities. In some embodiments, the first impedance component 304, the second impedance component 306, and/or the third impedance component 308 may include a switch. For example, the processor 12, or any other viable component, may generate control signals to program the programmable resistors, capacitors, and/or inductors. Moreover, the processor 12, or any other viable component, may provide the control signals to the switches to couple or uncouple (e.g., bypass) the first impedance component 304, the second impedance component 306, and/or the third impedance component 308.

As such, the T-section impedance circuit 302 may reduce an amplitude of noise and/or leakage of the first cell 126 (e.g., the CM noise 164) at the second cell 128 and/or reduce an amplitude of noise and/or leakage of the second cell 128 (e.g., the CM noise 166) at the first cell 126. As discussed above, the first inductor 182 and the second inductor 184 may inductively couple with a coupling factor (K) equal to or above the first threshold for signals having an oscillation frequency within the resonant frequency range. Moreover, the first inductor 182 and the second inductor 184 may inductively uncouple for signals having an oscillation frequency outside the resonant frequency range based on a coupling factor equal to or below a second threshold. Accordingly, the VCO 63 may generate the output signal 110 having the desired oscillation frequency within the resonant frequency range with reduced phase noise based on including the T-section impedance circuit 302.

Figure 9:
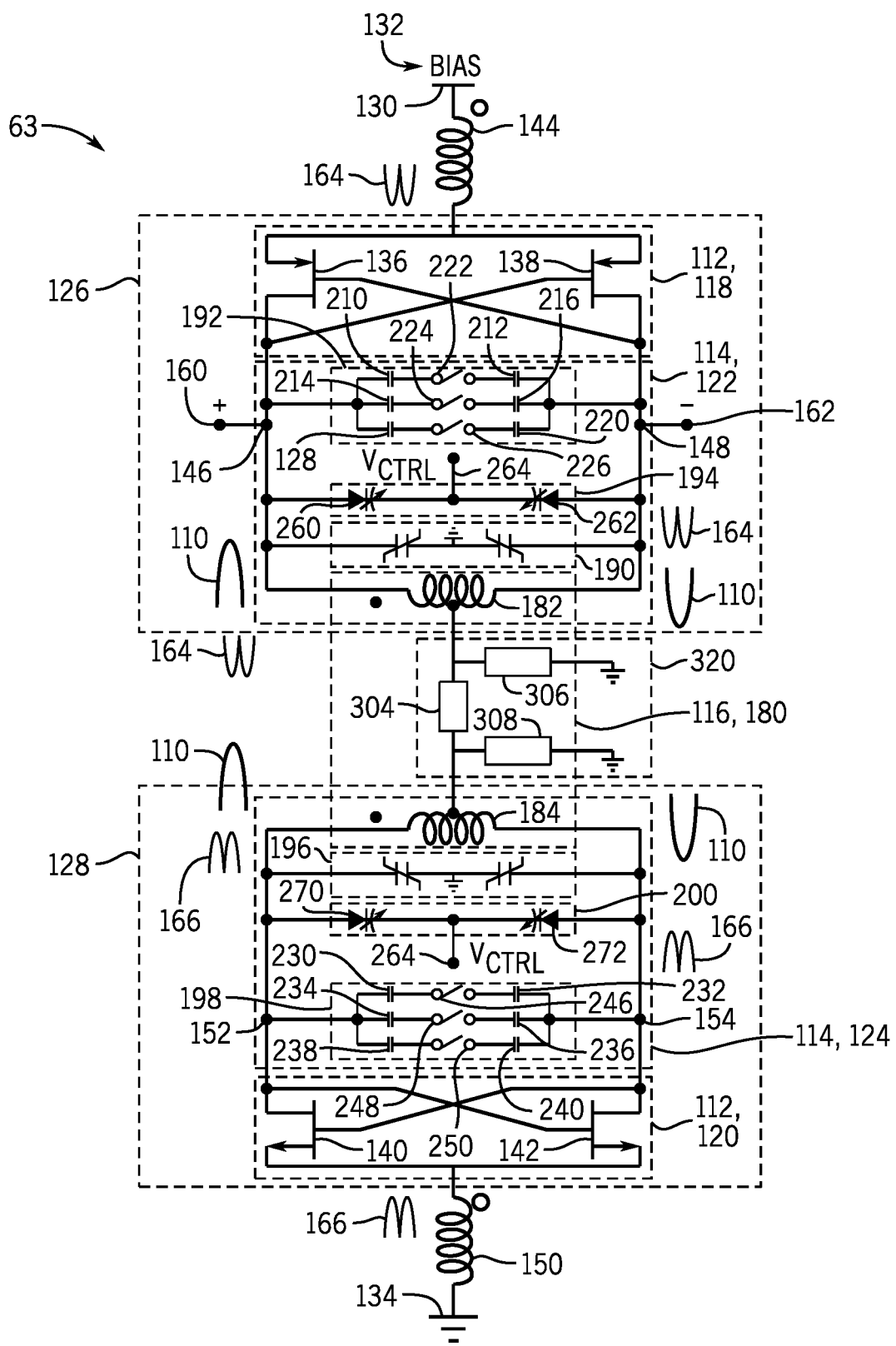
FIG. 9 is a schematic diagram of the VCO of FIG. 6 where the common-mode isolation circuitry includes the transformer and a PI-section impedance circuit, according to embodiments of the present disclosure.

FIG. 9 is a schematic diagram of the VCO 63 where the common-mode isolation circuitry 116 includes the transformer 180 and a PI-section impedance circuit 320, according to embodiments of the present disclosure. In the depicted embodiment, the common-mode isolation circuitry 116 may include the PI-section impedance circuit 320 coupled to (e.g., tapped onto) the first inductor 182 and the second inductor 184. The PI-section impedance circuit 320 may include a first impedance component 304 coupled to (e.g., tapped onto) the first inductor 182 and the second inductor 184. The PI-section impedance circuit 320 may include a second impedance component 306 coupled to the first inductor 182 and the ground terminal 134. The PI-section impedance circuit 320 may include a third impedance component 308 coupled to the second inductor 184 and the ground terminal 134.

The PI-section impedance circuit 320 may have an impedance value corresponding to uncoupling the signals having an oscillation frequency outside the resonant frequency range (e.g., CM noises 164 and 166). The first impedance component 304, the second impedance component 306, and the third impedance component 308 may each include a programmable or non-programmable resistor, capacitor, and/or inductor. For example, the first impedance component 304, the second impedance component 306, and/or the third impedance component 308 may include the common-mode degeneration inductor 300 among other possibilities. In some embodiments, the first impedance component 304, the second impedance component 306, and/or the third impedance component 308 may include a switch. For example, the processor 12, or any other viable component, may generate control signals to program the programmable resistors, capacitors, and/or inductors. Moreover, the processor 12, or any other viable component, may provide the control signals to the switches to couple or uncouple (e.g., bypass) the first impedance component 304, the second impedance component 306, and/or the third impedance component 308.

As such, the PI-section impedance circuit 320 may reduce an amplitude of noise and/or leakage of the first cell 126 (e.g., the CM noise 164) at the second cell 128 and/or reduce an amplitude of noise and/or leakage of the second cell 128 (e.g., the CM noise 166) at the first cell 126. As discussed above, the first inductor 182 and the second inductor 184 may inductively couple with a coupling factor (K) equal to or above the first threshold for signals having an oscillation frequency within the resonant frequency range. Moreover, the first inductor 182 and the second inductor 184 may inductively uncouple for signals having an oscillation frequency outside the resonant frequency range based on a coupling factor equal to or below a second threshold. Accordingly, the VCO 63 may generate the output signal 110 having the desired oscillation frequency within the resonant frequency range with reduced phase noise based on including the PI-section impedance circuit 320.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform] ing [a function] . . . " or "step for [perform] ing [a function] . . . ," it is intended that such elements are to be interpreted under 35 U.S.C. 112 (f). However, for any claims containing elements designated in any other manner, it is intended that such elements are not to be interpreted under 35 U.S.C. 112 (f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

An electronic device may include an antenna and a voltage-controlled oscillator (VCO) including a first voltage-controlled current source, a first inductor-capacitor tank circuit coupled to the first voltage-controlled current source, a first impedance component coupled to the first inductor-capacitor tank circuit, a second inductor-capacitor tank circuit coupled to the first inductor-capacitor tank circuit that may inductively couple to the first inductor-capacitor tank circuit, and a second voltage-controlled current source coupled to the second inductor-capacitor tank circuit and coupled to a ground terminal.

The first inductor-capacitor tank circuit may include a first capacitor and a first inductor having a first resonant frequency within a resonant frequency range, the second inductor-capacitor tank circuit may include a second capacitor and a second inductor having a second resonant frequency within the resonant frequency range, the first inductor and the second inductor may inductively couple based on signals having a desired oscillation frequency within the resonant frequency range, the first inductor and the second inductor may inductively uncouple based on signals having an undesired oscillation frequency outside the resonant frequency range.

The electronic device may include a second impedance component coupled to the first impedance component and the second inductor-capacitor tank circuit, the second inductor-capacitor tank circuit being coupled to the first impedance component via the second impedance component, and a third impedance component coupled to the first impedance component and the second impedance component.

The electronic device may include a second impedance component coupled to the first impedance component and the first inductor-capacitor tank circuit and a third impedance component coupled to the first impedance component and the second inductor-capacitor tank circuit.

The electronic device may include a receiver including the VCO, wherein the VCO may receive a received signal from the antenna, the VCO may output an output signal indicative of a frequency and phase of the received signal.

The electronic device may include a transmitter including the VCO, wherein the VCO may couple to a voltage source, the VCO may output an output signal corresponding to a carrier signal to modulate a transmission signal for transmission by the antenna.

A voltage-controlled oscillator (VCO) may include a first inductor-capacitor tank circuit that may receive a direct current (DC) signal, a first impedance component coupled to the first inductor-capacitor tank circuit, and a second inductor-capacitor tank circuit coupled to the first impedance component, the second inductor-capacitor tank circuit may inductively couple to the first inductor-capacitor tank circuit to generate an output signal having a desired oscillation frequency within a resonant frequency range based on the DC signal, and inductively uncouple from the first inductor-capacitor tank circuit based on signals having an undesired oscillation frequency outside the resonant frequency range.

The first impedance component may include a degeneration inductor that may reduce an amplitude of the signals having the undesired oscillation frequency.

The VCO may include a second impedance component coupled to the first impedance component and the second inductor-capacitor tank circuit, the second inductor-capacitor tank circuit being coupled to the first impedance component via the second impedance component, and a third impedance component coupled to the first impedance component and the second impedance component.

The VCO may include a second impedance component coupled to the first impedance component and the first inductor-capacitor tank circuit and a third impedance component coupled to the first impedance component and the second inductor-capacitor tank circuit.

The VCO may include a first voltage-controlled current source and a second voltage-controlled current source, the first voltage-controlled current source may couple to a voltage source and the first inductor-capacitor tank circuit, the second voltage-controlled current source may couple to the second inductor-capacitor tank circuit and a ground terminal, the first voltage-controlled current source and the second voltage-controlled current source may generate the DC signal based on a bias voltage of the voltage source.

The first inductor-capacitor tank circuit may include a first capacitor and a first inductor having a resonant frequency corresponding to the desired oscillation frequency and the second inductor-capacitor tank circuit may include a second capacitor and a second inductor having a resonant frequency corresponding to the desired oscillation frequency, the first inductor and the second inductor may inductively couple based on signals having the desired oscillation frequency and may inductively uncouple based on signals having the undesired oscillation frequency.

A voltage-controlled oscillator (VCO) including a first voltage-controlled current source that may couple to a voltage source, a first inductor-capacitor tank circuit coupled to the first voltage-controlled current source, a first impedance component coupled to the first inductor-capacitor tank circuit, a second inductor-capacitor tank circuit coupled to the first impedance component, and a second voltage-controlled current source coupled to the second inductor-capacitor tank circuit that may couple to a ground terminal.

The first impedance component may include a degeneration inductor that may reduce an amplitude of signals having an undesired oscillation frequency outside a resonant frequency range of the first inductor-capacitor tank circuit and the second inductor-capacitor tank circuit.

The VCO may include a second impedance component coupled to the first impedance component and the second inductor-capacitor tank circuit, the second inductor-capacitor tank circuit being coupled to the first impedance component via the second impedance component, and a third impedance component coupled to the first impedance component and the second impedance component.

The VCO may include a second impedance component coupled to the first impedance component and the first inductor-capacitor tank circuit and a third impedance component coupled to the first impedance component and the second inductor-capacitor tank circuit.

The first inductor-capacitor tank circuit, the second inductor-capacitor tank circuit, or both may output an output signal based on a bias voltage of the voltage source.

The first inductor-capacitor tank circuit may include a first capacitor and a first inductor having a first resonant frequency within a resonant frequency range and the second inductor-capacitor tank circuit may include a second capacitor and a second inductor having a second resonant frequency within the resonant frequency range.

The first inductor and the second inductor may inductively couple based on signals having a desired oscillation frequency within a resonant frequency range of the first inductor-capacitor tank circuit and the second inductor-capacitor tank circuit.

The first inductor and the second inductor may inductively uncouple based on signals having an undesired oscillation frequency outside a resonant frequency range of the first inductor-capacitor tank circuit and the second inductor-capacitor tank circuit.

The invention claimed is:

1. An electronic device comprising:
   an antenna; and
   a voltage-controlled oscillator (VCO) comprising
   a first voltage-controlled current source,
   a first inductor-capacitor tank circuit coupled to the first voltage-controlled current source, the first inductor-capacitor tank circuit comprising a first inductor,
   a second inductor tapped onto the first inductor-capacitor tank circuit;
   a second inductor-capacitor tank circuit coupled to the second inductor; and
   a second voltage-controlled current source coupled to the second inductor-capacitor tank circuit and coupled to a ground terminal.

2. The electronic device of claim 1, wherein the first inductor-capacitor tank circuit comprises a first capacitor and the first inductor having a first resonant frequency within a resonant frequency range, the second inductor-capacitor tank circuit comprises a second capacitor and a third inductor having a second resonant frequency within the resonant frequency range, the first inductor and the third inductor being configured to inductively couple based on signals having a desired oscillation frequency within the resonant frequency range, the first inductor and the third inductor being configured to inductively uncouple based on signals having an undesired oscillation frequency outside the resonant frequency range.

3. The electronic device of claim 1, wherein the VCO is configured to receive a received signal from the antenna, the VCO being configured to output an output signal indicative of a frequency and phase of the received signal.

4. The electronic device of claim 1, wherein the VCO is configured to generate an output signal corresponding to a carrier signal to modulate a transmission signal for transmission by the antenna.

5. A voltage-controlled oscillator (VCO) comprising:
   a first inductor-capacitor tank circuit configured to receive a direct current (DC) signal, the first inductor-capacitor tank circuit comprising a first inductor;
   a second inductor tapped onto the first inductor; and
   a second inductor-capacitor tank circuit coupled to the second inductor, the second inductor-capacitor tank circuit configured to inductively couple to the first inductor-capacitor tank circuit to generate an output signal having a desired oscillation frequency within a resonant frequency range based on the DC signal, inductively uncouple from the first inductor-capacitor tank circuit based on signals having an undesired oscillation frequency outside the resonant frequency range.

6. The VCO of claim 5, comprising a first voltage-controlled current source and a second voltage-controlled current source, the first voltage-controlled current source configured to couple to a voltage source and the first inductor-capacitor tank circuit, the second voltage-controlled current source configured to couple to the second inductor-capacitor tank circuit and a ground terminal.

7. The VCO of claim 6, wherein the first voltage-controlled current source and the second voltage-controlled current source are configured to generate the DC signal based on a bias voltage of the voltage source.

8. The VCO of claim 5, wherein the first inductor-capacitor tank circuit comprises a first capacitor and the first inductor having a first resonant frequency corresponding to the desired oscillation frequency and the second inductor-capacitor tank circuit comprises a second capacitor and a third inductor having a second resonant frequency corresponding to the desired oscillation frequency.

9. The VCO of claim 8, wherein the first inductor and the third inductor are configured to inductively couple based on signals having the desired oscillation frequency and configured to inductively uncouple based on signals having the undesired oscillation frequency outside the resonant frequency range.

10. A voltage-controlled oscillator (VCO) comprising:
    a first voltage-controlled current source configured to couple to a voltage source;
    a first inductor-capacitor tank circuit coupled to the first voltage-controlled current source, the first inductor-capacitor tank circuit comprising a first inductor;
    a second inductor-capacitor tank circuit comprising a second inductor;
    a third inductor tapped onto the first inductor and the second inductor; and
    a second voltage-controlled current source coupled to the second inductor-capacitor tank circuit and configured to couple to a ground terminal.

11. The VCO of claim 10, wherein the first voltage-controlled current source comprises a first switch and a second switch, a source terminal of the first switch and a source terminal of the second switch being configured to couple to the voltage source, a gate terminal of the first switch configured to couple to a drain terminal of the second switch, a gate terminal of the second switch configured to couple to a drain terminal of the first switch, and the drain terminal of the first switch and the drain terminal of the second switch coupled to the first inductor-capacitor tank circuit.

12. The VCO of claim 10, wherein a capacitance value of the first inductor-capacitor tank circuit corresponds to a capacitance value of the second inductor-capacitor tank circuit.

13. The VCO of claim 10, wherein
    the first inductor-capacitor tank circuit comprises a first capacitor bank, a first switched capacitor circuit, a first varactor, or any combination thereof, and
    the second inductor-capacitor tank circuit comprises a second capacitor bank, a second switched capacitor circuit, a second varactor, or any combination thereof.

14. The VCO of claim 10, wherein the first inductor-capacitor tank circuit, the second inductor-capacitor tank circuit, or both are configured to output an output signal based on a bias voltage of the voltage source.

15. The VCO of claim 10, wherein the first inductor-capacitor tank circuit comprises a first capacitor and the first inductor having a first resonant frequency within a resonant frequency range and the second inductor-capacitor tank circuit comprises a second capacitor and the second inductor having a second resonant frequency within the resonant frequency range.

16. The VCO of claim 15, wherein the first inductor and the second inductor are configured to inductively couple based on signals having a desired oscillation frequency within the resonant frequency range.

17. The VCO of claim 15, wherein the first inductor and the second inductor are configured to inductively uncouple based on signals having an undesired oscillation frequency outside the resonant frequency range.

18. The VCO of claim 10, wherein the second voltage-controlled current source comprises a third switch and a fourth switch, a source terminal of the third switch and a source terminal of the fourth switch being configured to couple to the ground terminal, a gate terminal of the third switch configured to couple to a drain terminal of the fourth switch, a gate terminal of the fourth switch configured to couple to a drain terminal of the third switch, and the drain terminal of the third switch and the drain terminal of the fourth switch coupled to the second inductor-capacitor tank circuit.

19. The electronic device of claim 2, wherein the second inductor is tapped onto the third inductor.

20. The VCO of claim 8, wherein the first inductor is tapped onto the third inductor.

* * * * *